(12) United States Patent
Subranni et al.

(10) Patent No.: US 12,000,879 B2
(45) Date of Patent: Jun. 4, 2024

(54) APPARATUS FOR THE AUTOMATED ASSEMBLY OF A PROBE HEAD

(71) Applicant: Technoprobe S.p.A., Cernusco Lombardone (IT)

(72) Inventors: Roberto Subranni, Cernusco Lombardone (IT); David Heriban, Ecole Valentin (FR); Jean-Christophe Villain, Dole (FR); Jocelyn Perreau, Bonnay (FR); Florent Perrocheau, Besançon (FR); Anne Delettre, Besançon (FR)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 763 days.

(21) Appl. No.: 16/997,726

(22) Filed: Aug. 19, 2020

(65) Prior Publication Data

US 2020/0379015 A1 Dec. 3, 2020

Related U.S. Application Data

(63) Continuation-in-part of application No. PCT/EP2019/053725, filed on Feb. 14, 2019.

(30) Foreign Application Priority Data

Feb. 20, 2018 (IT) .................. 102018000002877

(51) Int. Cl.
*B23P 19/00* (2006.01)
*G01R 1/073* (2006.01)
*G01R 3/00* (2006.01)

(52) U.S. Cl.
CPC .......... *G01R 3/00* (2013.01); *G01R 1/07307* (2013.01)

(58) Field of Classification Search
CPC .... G01R 3/00; G01R 1/0416; G01R 1/07307; G01R 1/07314; G01R 31/2886
See application file for complete search history.

(56) References Cited

U.S. PATENT DOCUMENTS 5,214,374 A * 5/1993 St. Onge .................. G01R 1/04
324/763.01
5,841,292 A 11/1998 Gallagher
(Continued)

FOREIGN PATENT DOCUMENTS

CN 107250808 A 10/2017
CN 107430150 A 12/2017
(Continued)

*Primary Examiner* — Paul D Kim
(74) *Attorney, Agent, or Firm* — Seed IP Law Group LLP

(57) ABSTRACT

An apparatus for the automated assembly of a probe head for testing electronic devices integrated on a semiconductor wafer, includes a support adapted to support at least two parallel guides, which are provided with a plurality of respective guides holes, and at least one holding means adapted to hold a contact probe to be housed in the guides holes, of the guides. Suitably, the support is a movable support adapted to be moved according to a preset trajectory between a first position, wherein the contact probe is held by the holding means at a predetermined position outside the guides holes, and a second position wherein the contact probe, which is held at the predetermined position, is housed in a set of guides holes that are substantially concentric to each other.

13 Claims, 4 Drawing Sheets

(56) References Cited

U.S. PATENT DOCUMENTS

| | | | |
|---|---|---|---|
| 6,960,923 B2 * | 11/2005 | Eldridge | G01R 31/2851 |
| | | | 439/135 |
| 2015/0054537 A1 | 2/2015 | Taber, Jr. | |
| 2015/0061713 A1 | 3/2015 | Shia et al. | |
| 2018/0003767 A1 | 1/2018 | Crippa et al. | |

FOREIGN PATENT DOCUMENTS

| | | | |
|---|---|---|---|
| CN | 107430151 A | | 12/2017 |
| CN | 107533084 A | | 1/2018 |
| CN | 107580681 A | | 1/2018 |
| JP | 2002071717 A | * | 3/2002 |
| KR | 10-2008-0003836 A | | 1/2008 |

* cited by examiner

APPARATUS FOR THE AUTOMATED ASSEMBLY OF A PROBE HEAD

BACKGROUND

Technical Field

The present disclosure refers to an apparatus and a corresponding method for the automated assembly of a probe head for testing electronic devices integrated on a semiconductor wafer, and the following description is made with reference to this field of application with the sole aim of simplifying the presentation thereof.

Description of the Related Art

As it is well known, a probe head is an electronic device adapted to electrically connect a plurality of contact pads of a microstructure, such as an integrated device, with corresponding channels of a testing apparatus that performs the functionality testing thereof, in particular the electric testing, or the test, generically.

The test, which is performed on integrated devices, is particularly useful in detecting and isolating defective devices as early as in the manufacturing phase. Normally, probe heads are therefore used for the electric test of devices integrated on wafers before cutting and assembling them inside a containment package.

In general, a probe head comprises a plurality of movable contact elements or contact probes held by at least one pair of guides or supports which are substantially plate-shaped and parallel to each other. The guides are equipped with suitable guide holes and are arranged at a certain distance from each other in order to leave a free space or air gap for the movement and possible deformation of the contact probes, which are slidably housed in the guide holes. The pair of guides comprises in particular an upper guide and a lower guide, both provided with guide holes within which the contact probes axially slide, the contact probes being usually formed by wires of special alloys with good electric and mechanical properties.

Good connection between the contact probes of the probe head and the contact pads of the device under test is ensured by the pressure of the probe head on the device itself, the contact probes undergoing, during the pressing contact, a bending inside the air gap between the guides and a sliding inside the related guide holes. Probe heads of this kind are commonly called "Vertical probe head".

According to a known methodology, the probe heads of the above described type may be assembled by means of automatic apparatuses which place the contact probes into the corresponding guide holes of the guides, the latter being held fixed on a suitable support, also held fixed. Specifically, a movable holding means holds the contact probes as much as possible vertically and inserts them into the guide holes of the guides according to a particular preset order.

Such a solution has the drawback that the assembly of the probe head strongly depends on the shape of the contact probe and on the related alignment of the guide holes of the guides of the probe head itself, said features non being controllable and limiting the effectiveness of the assembly. In some cases, when the probes have a particularly irregular profile and/or the related guide holes of the guides are very misaligned, the assembly may not be successful (namely the probes do not manage to be inserted into the guide holes) and this may even cause the breakage of the probes, in any case resulting in a disadvantageous interruption of the manufacturing process.

An apparatus for loading test pin into a text fixture is described in the U.S. Pat. No. 5,841,292 issued on Nov. 24, 1998 in the name of Gallagher (Star Technology Group, Inc.).

In practice, the automatic assembly methodologies have such frequent problems that manual assembly by means of specialized operators is still preferable, who may also be assisted by a system of cameras and lighting. Obviously, the manual assembly has times and costs which are linked to the skill of the specialized operators and does not allow high production scales or to cope with peaks of requests, the period required to train a specialized operator being often longer than the peak period of production that would require such a specialized operator.

Therefore, it is desirable to provide an apparatus, and a corresponding method, for the assembly of a probe head such as to allow overcoming the limitations and drawbacks which still nowadays affect the known solutions, in particular capable of automatically assembling, effectively and quickly, a probe head without being limited by the profile of the contact probes and by the relative alignment of the guide holes in which the contact probes must be housed, thus allowing an assembly process with an improved control.

BRIEF SUMMARY

According to the present disclosure, an apparatus for the automated assembly of a probe head is provided, wherein a contact probe is held at a predetermined position by a suitable holding means and, instead of moving the holding means (and thus the contact probe) towards the guide holes of the guides of the probe head to be assembled, a support whereon the guided are arranged is moved, said support having a plurality of degrees of freedom of movement and being able to follow a suitable trajectory calculated according to the profile of the contact probe so as to fit the guides onto the probe, which is held at the predetermined position by means of the holding means.

More in particular, an exemplary apparatus for the automated assembly of a probe head for testing electronic devices comprises a support adapted to hold at least two guides parallel and superimposed to each other, which are provided with a plurality of respective guide holes, as well as at least one holding means adapted to hold a contact probe to be housed in the guide holes of the guides, wherein the support is a movable support adapted to be moved, according to a preset trajectory, between a first position, wherein the contact probe is held by the at least one holding means at a predetermined position outside the guide holes, and a second position, wherein the contact probe, which is held at the predetermined position, is housed in a set of guide holes that are substantially concentric to each other and formed in the at least two guides.

More particularly, the disclosure comprises the following additional and optional features, taken singularly or in combination if necessary.

According to an aspect of the present disclosure, the apparatus may comprise actuators of the support and a central unit connected to the actuators, the trajectory being calculated in the central unit according to a profile of the contact probe, the central unit being adapted to transform the profile into control instructions which are sent to the actuators of the support.

According to another aspect of the present disclosure, the apparatus may comprise a first vision system, connected to the central unit, which captures images of the contact probe held by the at least one holding means at the predetermined position at the support, the profile of the contact probe being calculated from the images acquired by the first vision system.

According to another aspect of the present disclosure, the first vision system may comprise at least one pair of high-resolution cameras arranged at the support, the cameras forming a stereoscopic vision system for the formation of images of the contact probe.

Furthermore, the support may be a hexapod having six degrees of freedom of movement adjusted by the actuators.

According to another aspect of the present disclosure, the at least one holding means of the contact probe may be a terminal element of a mechanical arm that is able to move between the support and a storage element adapted to contain a plurality of contact probes.

In particular, the mechanical arm may comprise a first end portion including a first holding means and a second end portion including a second holding means, wherein one of the first or second holding means is adapted to hold a contact probe at the predetermined position at the support and the other holding means is adapted to simultaneously pick up a contact probe from the storage element.

The apparatus of the present disclosure may further comprise a second vision system which captures images of the contact probes housed in the storage element, the central unit being adapted to perform a first evaluation of the profile of the contact probes in the storage element based on the images captured by the second vision system so as to perform a preliminary discard of the contact probes.

According to another aspect of the present disclosure, the at least one holding means may comprise at least one pair of end-effectors which extend from a body thereof, as well as at least one first force sensor which is integrated in the body and which is adapted to measure the intensity with which the end-effectors hold the contact probe, the apparatus comprising a feedback system adapted to adjust the holding intensity of the contact probe by the end-effectors.

Still according to another aspect of the present disclosure, the at least one holding means may comprise at least one second force sensor adapted to measure the force exerted by the contact probe onto the guides during the movement of the support.

Furthermore, the at least one second force sensor may be connected to the central unit and adapted to send data thereto about the force exerted by the contact probe on the guides, the central unit being adapted to process the data to generate information about the force as a function of the position of the contact probe in the guides and, if the force exceeds a predetermined value, being able to correct the trajectory of the support or able to interrupt and repeat the movement of the support with the same trajectory.

The apparatus may finally comprise at least one further vision system adapted to assess which guide hole the contact probe emerges from.

The present disclosure also refers to a method for the automated assembly of a probe head for testing electronic devices, the method comprising at least the steps of:
 placing at least two parallel guides on a support, the guides being provided with a plurality of respective guide holes;
 superimposing the parallel guides so that the respective guide holes are substantially concentric to each other; and
 holding, by means of at least one holding means, a contact probe to be housed in the guide holes of the guides,
the method further comprising a step of moving the support, according to a preset trajectory, between a first position, wherein the contact probe is held by the at least one holding means at a predetermined position outside the guide holes, and a second position, wherein the contact probe, which is held at the predetermined position, is housed in a set of guide holes that are substantially concentric to each other.

According to an aspect of the present disclosure, the step of moving may be preceded at least by the steps of:
 capturing images of the contact probe by means of a first vision system;
 sending the images to a central unit and obtaining a profile of the contact probe from projections obtained from the images;
 transforming the profile of the contact probe into control instructions of actuators of the support; and
 transmitting the control instructions from the central unit to the actuators of the support, so that it can be moved according to the trajectory.

According to another aspect of the present disclosure, the step of transforming the profile into control instructions may be preceded by a step of comparing the profile of the contact probe with a nominal profile expected for the contact probe, the method comprising a subsequent step of discarding the contact probe if the obtained profile is far from the nominal profile expected for the specific contact probe, the step of comparing involving the evaluation of the skew of the contact probe and/or the evaluation of local deformations of the contact probe.

In particular, the profile may be obtained through the steps of:
 identifying a plurality of points along a body of the contact probe; and
 interpolating the points.

According to an aspect of the present disclosure, the method may further comprise the steps of:
 calculating the coordinates of the guide holes of the guides; and
 storing the coordinates in the central unit, wherein the coordinates are calculated with respect to a point of the guides which does not vary in case of a rotation thereof, and wherein the control instructions take into account both the profile of the contact probe, and the coordinates of the guide holes.

The method may further comprise a step of moving a mechanical arm between the support and a storage element adapted to contain a plurality of contact probes, wherein the mechanical arm comprises a first end portion, including a first holding means, and a second end portion including a second holding means, one of the first or second holding means being adapted to hold a contact probe at the predetermined position at the support and the other holding means being adapted to pick up a contact probe from the storage element, the holding and picking up steps occurring simultaneously on different contact probes and being carried out by the first holding means and by the second holding means in alternation at the support and at the storage element, respectively.

The method may further comprise a step of capturing images of the contact probes housed in the containment element by a second vision system, the method comprising a subsequent step of discarding a contact probe based on the images of the second vision system.

The method may further comprise a step of detecting the force exerted by the contact probe onto the guides during the movement of the support by at least one force sensor integrated into the at least one holding means.

There is also to say that the step of calculating the force exerted by the contact probe onto the guides may be followed by a step of sending to the central unit data about the force and by a step of processing the data in order to generate information about the force as a function of the position of the contact probe in the guides.

The method may further comprise a step of correcting the trajectory of the support if the force exceeds a predetermined value or a step of interrupting and repeating the movement of the support with the same trajectory if the force exceeds a predetermined value.

Finally, the steps of the method may be repeated for each set of concentric guide holes of the guides in a preset sequence, the holes of each of the sets following a specific trajectory calculated each time according to the profile of the contact probe to be housed therein.

The features and advantages of the apparatus and method according to the disclosure will be apparent from the following description of an embodiment thereof, given by non-limiting example, with reference to the accompanying drawings.

DETAILED DESCRIPTION

Figure 1:
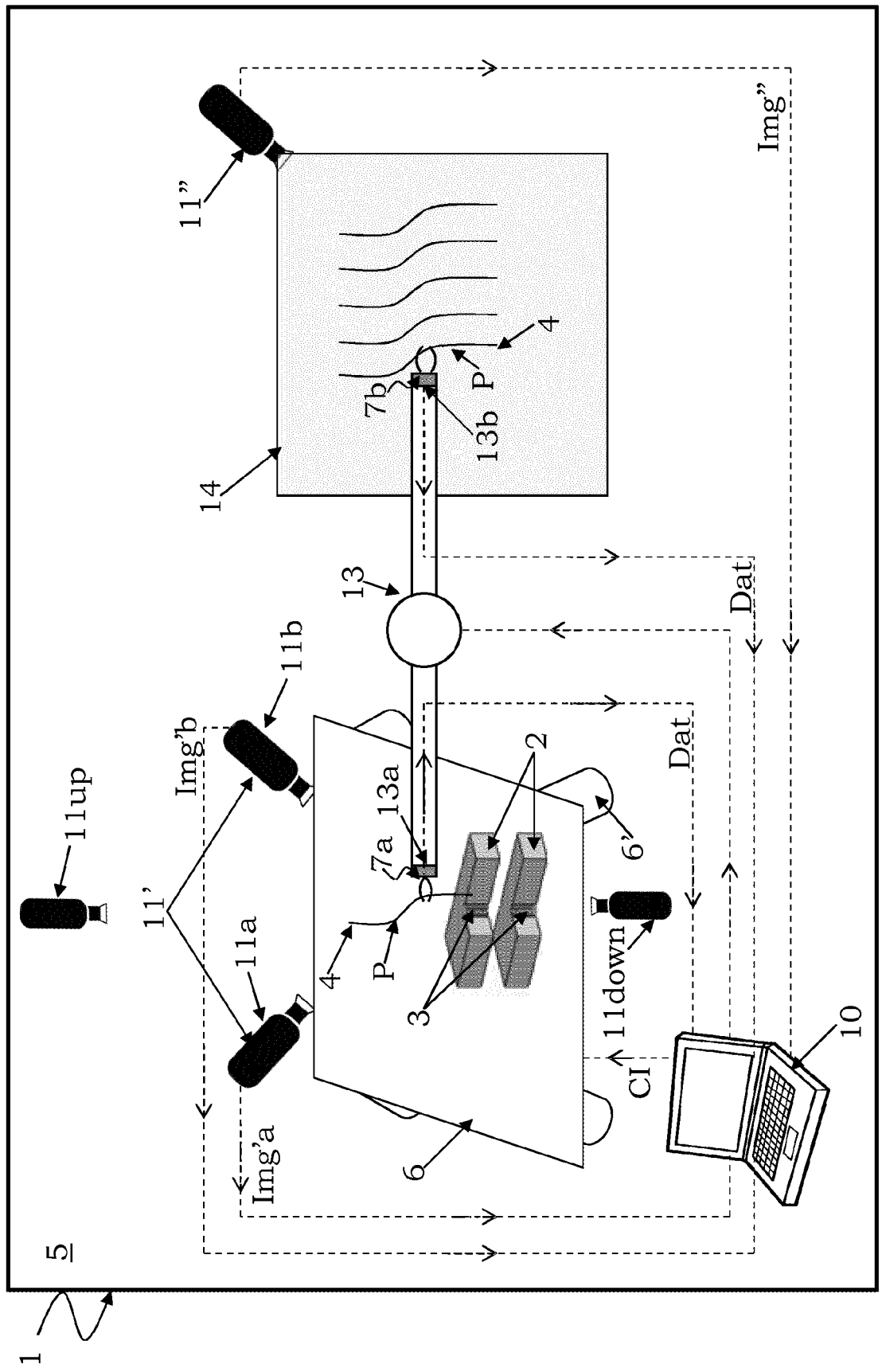
FIG. 1 schematically shows an apparatus for the automated assembly of a probe head according to the present disclosure.

Referring to the figures, and particularly to the example of FIG. 1, an apparatus according to the present disclosure is herein described, which is globally and schematically indicated with 1, which comprises means for the automated assembly of a probe head according to a method that will be hereinafter illustrated.

It should be noted that the figures represent schematic views and are not drawn to scale, instead they are drawn so as to enhance the important features of the disclosure. Furthermore, in the figures, the different elements are shown schematically, since their shape may vary according to the desired application. It should also be noted that in the figures identical reference numbers refer to elements identical in shape or function.

The probe head to be assembled through the apparatus 1 is adapted for testing electronic devices integrated on a semiconductor wafer and comprises at least one pair of parallel guides 2 separated by an air gap, the guides 2 being provided with respective guide holes 3 for slidingly housing a plurality of contact probes, each of the contact probes being indicated in the present description with reference number 4. It should be further underlined that respective guide holes of different guides where a single contact probe 4 is housed are substantially concentric to each other. In particular, the guide holes of different guides that are concentric to each other form a single set of concentric guide holes among a plurality of sets of concentric guide holes, each of said sets being adapted to house a different contact probe.

In a preferred example, the probe head comprises two pairs of parallel guides 2, namely a first pair of upper guides and a second pair of lower guides, which are separated from each other by a further air gap. In this regard, it is pointed out that in FIG. 1 only a pair of guides 2 is shown but, as above noticed, the present disclosure is not limited to a prefixed number of guides 2, the figures being only provided by way of non-limiting example of the present disclosure.

As illustrated in FIG. 1, in its more general form the apparatus 1 comprises a support element 5 whereon all of its main components are arranged. By way of non-limiting example of the present disclosure, the support element 5 may be an optical table equipped with an anti-vibration system, for example a pneumatic compressed air system, so as to make the assembly process disclosed in the present disclosure immune from possible vibrations of the surrounding environment.

Furthermore, the apparatus 1 comprises a support 6 placed on the support element 5, on the support 6 the guides 2 of the probe head to be assembled being arranged, which are superimposed to each other and with respective guide holes placed so as to be concentric in order to form sets of concentric guide holes for the various contact probes to be assembled. As it will be herein after described in detail, the support 6 is the distinctive element of the present disclosure.

The apparatus 1 further comprises at least one holding means 7a, which is adapted to hold a contact probe 4 at a predetermined position at the support 6. For simplicity of illustration, FIG. 1 shows only a contact probe 4 and only a guide hole 3 for each guide 2, obviously only by way of indicative example.

Advantageously according to the present disclosure, the contact probe 4 is held at the predetermined position through the holding means 7a, whereas the support 6 is a moveable support adapted to move the guides 2 arranged thereon towards the contact probe 4, so as to fit the guides 2 onto the contact probe 4. As a result, according to the present disclosure, it is not the contact probe 4 that is moved and inserted into the guide holes 3 of the guides 2 of the probe head to be assembled, but it is the guides 2 that are moved through the support 6 towards the contact probe 4 in order to fit the guides 2 onto the contact probe 4. In other words, the guides 2 of the probe head to be assembled are moved through the support 6, so that the guide holes 3 of the guides 2 reach the contact probe 4 to be housed therein.

According to the present disclosure, the support 6 is thus a moveable support between a first position (herein also called "rest position"), wherein the contact probe 4 is held by the holding means 7a at the predetermined position outside the guide holes 3, and a second position (herein also called "assembly position"), wherein the contact probe 4, still held at the predetermined position through the holding means 7a, is housed in the guide holes 3, in particular in a set of guide holes which are substantially concentric to each other and obtained in the different guides 2.

This solution implies great advantages since there is much more freedom in the movement of the support 6 that supports the guides 2 with respect to that of the holding means 7a of the contact probe 4, thus allowing an effective assembly even if the contact probe 4 has an irregular profile or if the guide holes 3 of the guides 2 are not perfectly aligned to each other, as it will be clarified in the following. It is well known that the movement of the contact probes needs the application of forces which, due to the very reduced dimensions of the probes, often cause the deformation or even the breakage thereof, with the total impairment of the assembly or anyway of the correct operation of the assembled probe head.

By way of example, in a preferred embodiment of the present disclosure, the support 6 is a robotized hexapod, namely it is a support provided with six movable support elements or legs 6', which are provided with suitable actuators, the hexapod being thus provided with six degrees of freedom of movement. Such a support 6 has a high precision and repeatability in movement, with errors of less than one thousandth of a degree (0.001°). Likewise, such a support 6 is able to perform movements of minimum amount, still less than 0.001°, so as to allow a fine adjustment of the assembly process.

Suitably, the support 6 is moved according to a very precise trajectory that is calculated in a central unit 10 comprised in the apparatus 1 and provided with processing means, for instance a PC or generally any computerized unit, the central unit 10 being suitably connected to the actuators of the support 6 which cause the movement thereof.

In particular, the trajectory with which the support 6 moves is calculated according to a profile P of the contact probe 4 which are to be housed in the guide holes 3, the central unit 10 being adapted to transform the profile P into control instructions CI which are sent to the actuators of the support 6, in order to allow the movement thereof according to the trajectory. In other words, the support elements 6' of the support 6, in particular the actuators thereof, receive the control instructions CI from the central unit 10, so as to impart to the support 6 the adapted trajectory according to the profile P of the contact probe 4. This allows to also carry out the assembly process for a contact probe 4 having an irregular profile P, the trajectory of the support 6 being calculated precisely according to the profile P.

In order to obtain the profile P of the contact probe 4, the apparatus 1 comprises a first vision system 11', connected to the central unit 10, including in turn at least one pair of cameras 11a and 11b which are adapted to capture respective images Img'a and Img'b of the contact probe 4 held at the predetermined position from the holding element 7a. The cameras 11a and 11b are connected to the central unit 10 and send the captured images Img'a and Img'b thereto, so that the latter may obtain the profile P of the contact probe 4 from the images Img'a and Img'b.

The cameras 11a and 11b are high-resolution cameras, for instance 10 Megapixel or higher, and are arranged at the support 6 (in particular they are arranged at their focus distance) in order to take over the contact probe 4 held at the predetermined position in the most suitable way, thus forming a stereoscopic vision system.

Figure 2:
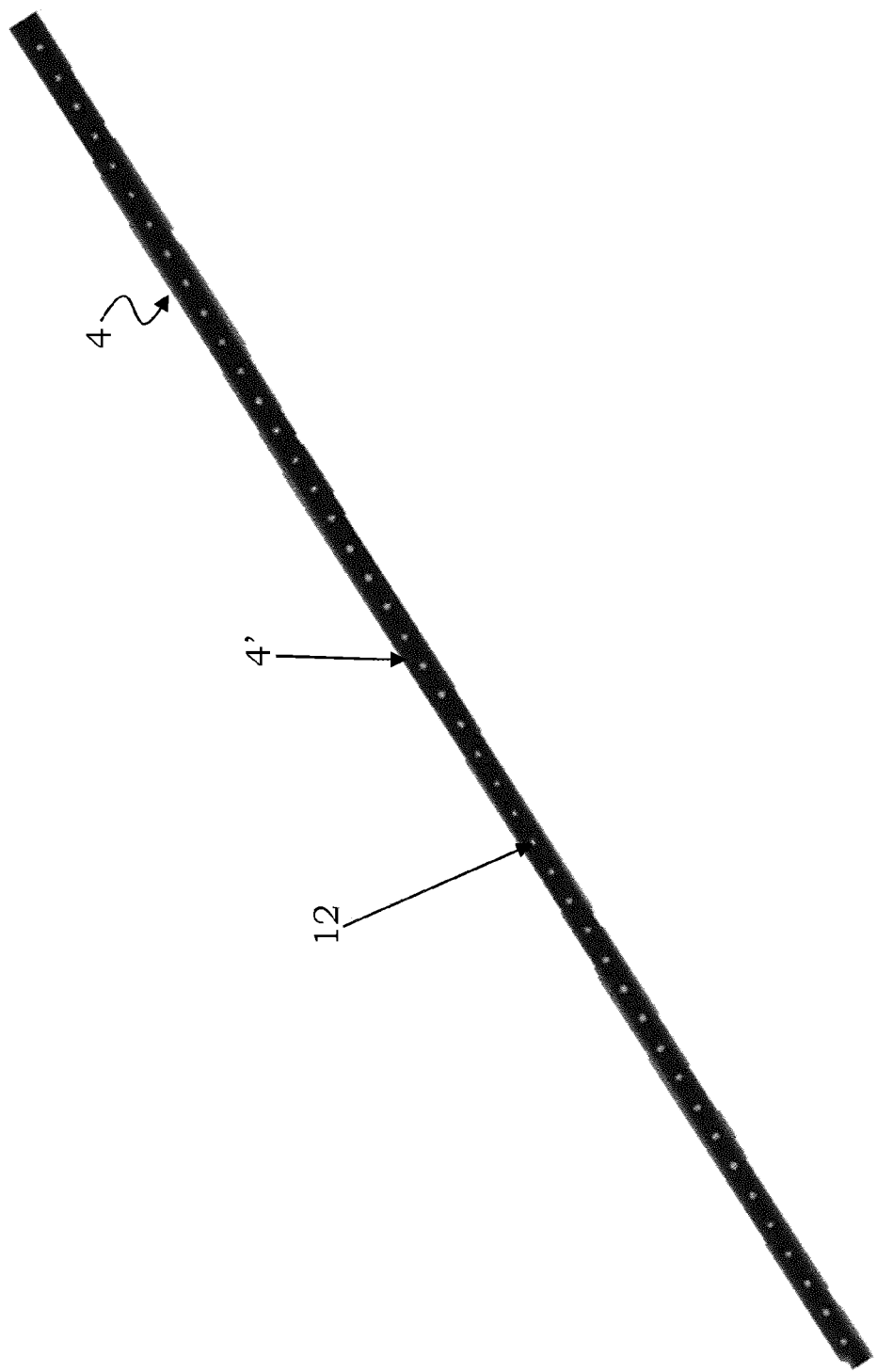
FIG. 2 schematically shows a contact probe whose profile is obtained by means of the apparatus and method of the present disclosure.

In particular, once the images Img'a and Img'b have been captured through the cameras 11a and 11b and once the projections of the contact probe 4 have been obtained therefrom on two orthogonal planes, the profile P of the contact probe 4 is obtained by identifying a plurality of points 12 along a body 4' of the contact probe 4. Interpolation of the points 12 thus provides the profile P of the probe, as schematically illustrated in FIG. 2.

Obviously, the above illustrated is repeated for each contact probe 4 and for each set of concentric guide holes, since in different sets different contact probes 4 having different profiles P are housed. As a result, the support 6 is moved each time according to a different trajectory which takes into account the profile P of the different contact probes 4.

Figure 3:
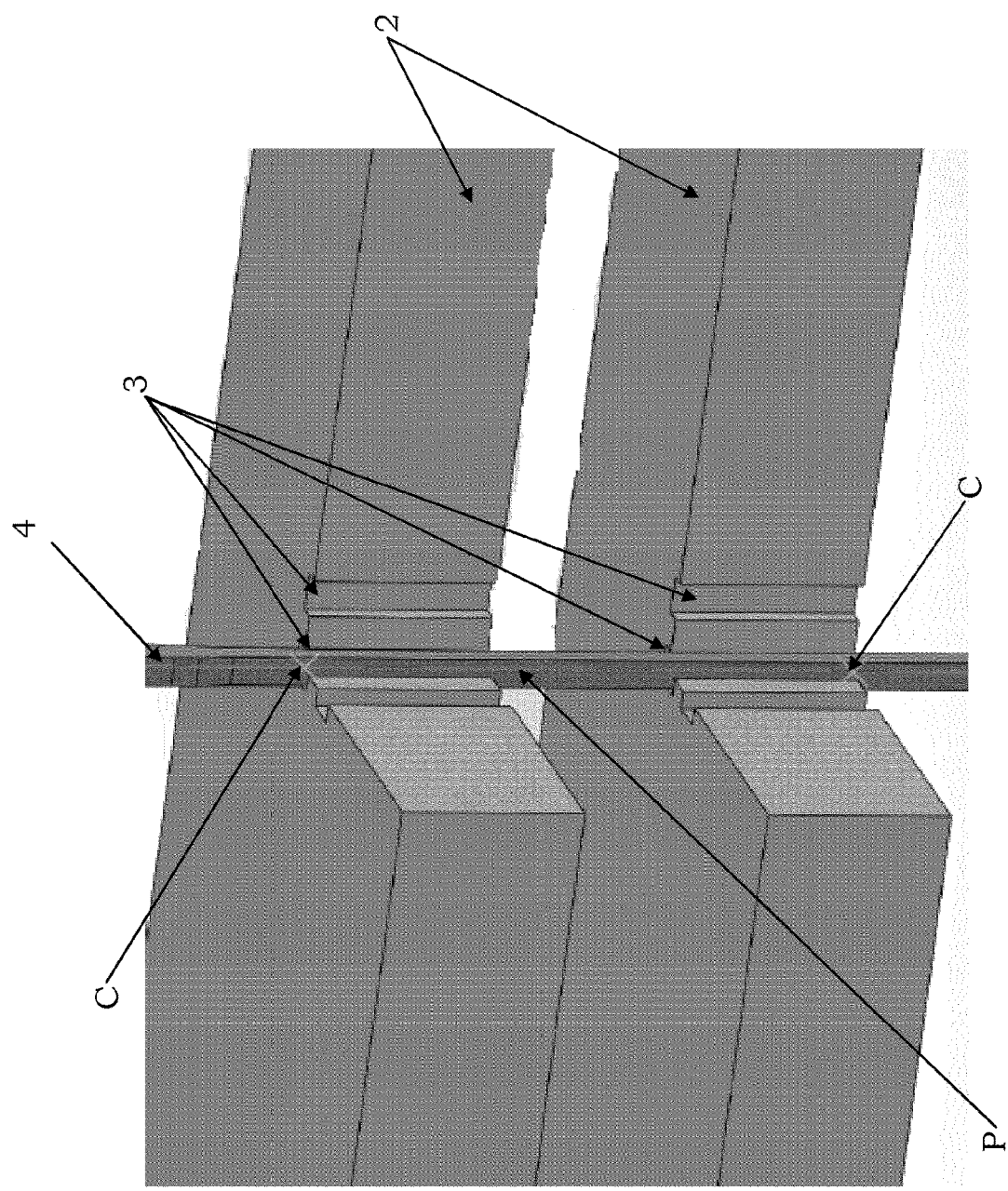
FIG. 3 schematically shows a pair of parallel guides which house a contact probe in respective guide holes.

Suitably, the present disclosure thus provides for the guides 2, and in particular the guide holes 3 thereof, to be moved thanks to the movement of the support 6 according to a trajectory that is calculated each time according to the profile P of the contact probe 4 to be housed therein. This is schematically shown in FIG. 3, wherein a pair of parallel guides 2 is illustrated, the pair of parallel guides 2 housing a contact probe 4 in respective guide holes 3 due to the movement of the support 6. Specifically, by sending the control instructions CI to the actuators of the support 6, namely to the support elements 6', the centers C of the guide holes 3, which house the contact probe 4 held by the holding means 7a, are forced to follow the preset trajectory, namely are forced to follow the profile P of the contact probe 4. In other words, during the movement of the support 6, the coordinates of the centers C of the guide holes 3 substantially coincide with the coordinates of the profile P of the contact probe 4, as illustrated in FIG. 3.

In this regard, it is pointed out that the coordinates of the guide holes 3 are calculated with respect to a point of the set of guides 2 that does not vary further to a rotation of the same, the point being thus the rotation center of the guides 2. The coordinates are then provided to the central unit 10 for calculating the trajectory of the support 6, as it will also be herein after specified. In other words, in order to ensure the correct operation of the apparatus 1, the coordinates of the centers C of all the guide holes 3 are calculated with respect to a common reference system, which originates in the rotation center of the guides 2.

Nominally, the origin point of the system of coordinates is placed at the center of a support frame (not illustrated in the figures), which is in turn placed on the support 6, the support frame supporting the guides 2 during the assembly. In particular, the point is evaluated from time to time according to the arrangement of the guides 2 on the support frame.

Figure 4A:
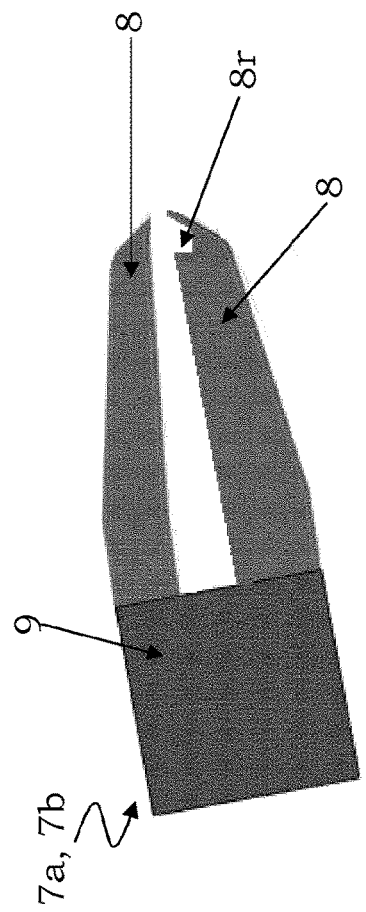
FIGS. 4A and 4B schematically show a holding means of contact probes according to the present disclosure.
Figure 4B:
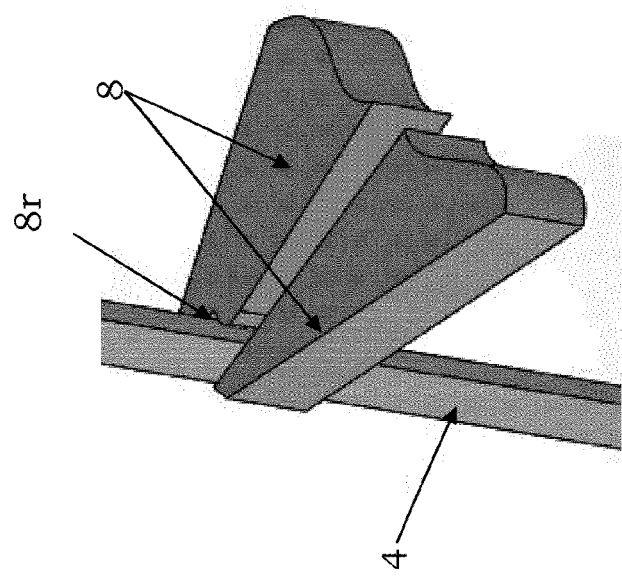

Referring now to FIGS. 4A and 4B, the holding means 7a comprises at least one pair of end-effectors or gripping elements 8 which are adapted to hold the contact probe 4, the end-effectors 8 extending from a body 9, which is preferably made of a piezoelectric material. In this way, the body 9 of the holding element 7a, deforming due to the piezoelectric effect, causes the movement of the end-effectors 8 thereto connected, the end-effectors 8 being thus able to pick up and hold the contact probes 4. In other words, the holding means 7a substantially in the shape of a clamp, where the gripping elements are arranged on a body preferably made of a piezoelectric material.

Furthermore, the end-effectors 8 are suitably shaped so as to ensure an effective holding of contact probes 4 having a rod-like body, at least one of the end-effectors 8 comprising at an end portion thereof a recess 8r forming a housing seat for the contact probes 4.

However, it is pointed out that the holding means 7a is not limited to the above described type, the embodiment being provided just by way of non-limiting example of the scope of the present disclosure, since any other suitable holding means can be formed.

The holding means 7a is adapted to apply to the contact probe 4 held by means of its end-effectors 8 a force sufficient to hold it in position without causing local deformations or breaking thereof. Suitably, the holding means 7a comprises a first force sensor integrated therein, the force sensor being adapted to measure the intensity with which its end-effectors 8 hold the contact probe 4, with a resolution of about 1 mN, for example. The apparatus 1 thus comprises a feedback system which, after having received the intensity values measured by the first force sensor, is adapted to adjust the holding intensity of the contact probe 4 by the end-effectors 8. In this way, it is possible to avoid holding the contact probes 4 with an excessive force, thus avoiding damaging them. Furthermore, the holding means 7a is formed so as to hold the contact probe 4 substantially without applying any vibration thereto.

Now still referring to FIG. 1, the holding means 7a is the terminal element of a mechanical arm 13, which is able to move between the support 6 and a storage element 14 that is adapted to contain a plurality of contact probes 4.

The storage element 14 is a support in which the plurality of contact probes 4 is held for instance through a gel and whereon the probes are arranged so that they can easily be picked up, the storage element 14 not being further discussed in the present disclosure since it is a conventional one.

In a preferred embodiment of the present disclosure, the mechanical arm 13 comprises a first end portion 13a, including in turn a first holding means 7a, and a second and opposite end portion 13b, including in turn a second holding means 7b, which is identical to the first holding means 7a.

In particular, one of the first or the second holding means, 7a or 7b, is adapted to hold a contact probe 4 at the predetermined position at the support 6 in the same instant when the other holding means, 7b or 7a, is adapted to pick up a different contact probe 4 from the storage element 14. In this way, the assembly of a contact probe occurs simultaneously to the picking up of a further and different probe, and, once the assembly of the contact probe has ended (namely after the support 6 has returned to the rest position), the mechanical arm 13 moves (for instance it rotates about a central point thereof) and the holding elements 7a and 7b reverse their position due to the movement of the mechanical arm 13, so that the further and different probe already picked up is brought at the support 6 and the other holding means picks up a new contact probe, with a subsequent speeding up of the assembly process, in particular eliminating any waiting time linked to the picking up of a new probe.

Furthermore, according to an embodiment of the present disclosure, the apparatus 1 also comprises a second vision system 11" that captures images Img" of the contact probes 4 housed in the storage element 14. The second vision system 11" may comprise a single camera, which generally has a resolution which is lower than that of the two cameras 11a and 11b of the first vision system 11', since it is intended to carry out a check of the profile P of the contact probes 4 that is less accurate than that of the first vision system 11'.

In particular, after sending the images Img" captured at the central unit 10, the central unit 10, based on the images Img", carries out a first evaluation of the profile P of the contact probes 4 in the storage element 14. From the images Img" it is in fact possible to obtain some preliminary parameters that allow preliminarily evaluating the profile of the contact probes and, as a result, it is possible to discard (and thus not to pick up) already in this step contact probes whose parameters obtained from the images Img" are outside predetermined parameters. In other words, through the second vision system 11" it is possible to preliminarily discard contact probes based on parameters that can be evaluated with only one camera and thus based on a single bidimensional image.

The first vision system 11' is in fact adapted to perform a metrological, quantitative check of the contact probes (by calculating parameters such as the skew and/or local deformations) as it will be illustrated herein after more in detail, whereas the second vision system 11" is adapted to perform a qualitative check of the contact probes.

Furthermore, the apparatus comprises at least two vision systems (for instance two other cameras), indicated in the present disclosure with reference number 11up and 11down. The vision system 11up is arranged above the support 6 and performs a general control of the whole apparatus 1, whereas the vision system 11down is arranged below the support 6 and is adapted to verify the correct assembly of the contact probes 4, for instance it is adapted to verify which guide hole 3 a contact probe 4 emerges from at the end of the assembly process.

The apparatus of the present disclosure is furthermore suitably lighted by lighting systems of the axial or annular led type.

Furthermore, advantageously according to the present disclosure, in order to obtain complete information about the assembly process, the holding means 7a and 7b comprise at least one second force sensor, which is adapted to measure the deformation undergone by the contact probes 4 during the movement of the support 6.

More particularly, the sensor integrated in the holding means is adapted to measure the force exerted by the contact probe 4 onto the guides 2 of the probe head to be assembled. In other words, by measuring the force exerted by the contact probe 4 onto the end-effectors 8 during the movement of the support 6, it is possible to measure the force exerted by the probe onto the guides and thus to verify the correct assembly.

Suitably, the second force sensor is connected to the central unit 10 and is adapted to send data Dat thereto about the force exerted by the contact probe 4 onto the guides 2 during the assembly, and therefore during the movement of the support 6. In particular, the central unit 10 is capable of processing the data Dat as received, so as to generate information about the force exerted by the contact probe 4 onto the guides 2 as a function of the position of the contact probe 4 in the guides 2, for instance as a function of the position of an end portion thereof. Furthermore, it is possible to generate in the central unit 10, based on the information, a chart of the force exerted by the contact probe 4 as a function of its position in the guides 2, the chart being displayed on a suitable display device connected to the central unit 10 (such as for instance a computer screen), thus also making visual information about the force available.

If the force measured exceeds a predetermined value, the central unit 10 is adapted to correct the control instructions CI sent to the actuators of the support 6, and thus to correct its trajectory, in order to bring the value of the force within the tolerated limits and thus to obtain an optimal assembly.

Alternatively, if the measured force exceeds a predetermined value, the central unit 10 is adapted to block the movement of the support 6 and to try again the assembly from the beginning with the same trajectory for a predetermined number of times.

In general, the values of the exerted force are in the order of about ten μN and the second force sensor works in a range of 40 mN with a resolution of at least 40 μN.

By way of example, if during the assembly the end of a contact probe abuts onto one of the guides or is inserted into the wrong guide hole, an excessive value of the exerted force by the contact probe will be detected, so indicating an error in the assembly process which may be corrected by recalibrating the trajectory of the support 6, the error not being easily detected by the previously mentioned further vision system 11down. The second force sensor, in addition to the vision system 11down, thus allows a precise control of the whole assembly process.

It is possible to provide the apparatus 1 with suitable moving means such as electric or hydraulic motors, associated with the support 6, in particular with the actuators thereof, as well as with the mechanical arm 13, and also possibly with the set of cameras for a better positioning thereof under the different operating conditions of the apparatus 1.

As previously mentioned, the present disclosure also relates to a method for the automated assembly of a probe head for testing electronic devices integrated on a semiconductor wafer. In particular, the method comprises at least the preliminary steps of arranging onto a support 6 at least two parallel guides 2, which are provided with a plurality of respective guide holes 3, and of holding, through at least one holding means 7a, a contact probe 4 to be housed into the respective guide holes 3 of the guides 2. Suitably, the guides 2 are superimposed to each other and with respective guide holes 3 placed so as to be concentric and to form sets of concentric guide holes, a particular contact probe 4 being housed in each set.

Advantageously according to the present disclosure, the support 6 is a moveable support and the method comprises a step of moving the support 6, based on a preset trajectory, between a first position (also called "rest position"), wherein the contact probe 4 is held by the holding means 7a at a predetermined position outside the guide holes 3, and a second position (also called "assembly position"), where the contact probe 4, still firmly held at the predetermined position, is housed in guide holes which are substantially concentric to each other (namely housed in a set of concentric guide holes). At the end of the step, the support 6 is thus returned to the first position and is ready to be newly moved to house a new contact probe 4 into the guide holes 3 of the guides 2.

Suitably, the trajectory according to which the support 6 is moved is calculated according to a profile P of the contact probe 4 to be housed into guide holes 3 which are concentric to each other.

For this reason, the above mentioned step of moving the support 6 is preceded by a step of capturing images Img'a and Img'b of the contact probe 4, which is held by the holding means 7a at the predetermined position at the support 6, through a first vision system 11'.

In a preferred embodiment of the present disclosure, the first vision system 11' comprises at least two cameras 11a and 11b which form a stereoscopic vision system. In this way, it is possible to obtain the profile P of the contact probe 4 in an extremely precise manner.

The step of capturing the images Img'a and Img'b is thus followed by a step of sending the images Img'a and Img'b to a central unit 10, in which the profile P of the contact probe 4 is obtained as above indicated from the images.

The central unit 10 is thus adapted to transform the profile P of the contact probe 4 thus obtained into control instructions CI of actuators of the support 6, in particular of support elements 6' thereof, the step of transforming the profile P being followed by a step of transmitting the control instructions CI from the central unit 10 to the actuators, so that the support 6 can be moved according to the suitable trajectory.

The holding means 7a is the terminal element of a movable mechanical arm 13 controlled by the central unit 10. In order to optimize the assembly of the probe head, the method of the present disclosure also comprises a step of moving the mechanical arm 13 between the support 6 and a storage element 14, which is adapted to contain a plurality of contact probes 4 to be housed into the guide holes 3.

Specifically, the mechanical arm 13 comprises a first end portion 13a, including in turn a first holding means 7a, and a second and opposite end portion 13b, including in turn a second holding means 7b. Suitably, one of the first or the second holding means, 7a or 7b, is adapted to hold a contact probe 4 at the predetermined position at the support 6 and the other holding means, 7b or 7a, is adapted to simultaneously pick up a contact probe from the storage element 14.

According to the present disclosure, the above steps of holding and picking up are carried out simultaneously and are followed by the first holding means 7a and by the second holding means 7b in alternation, according to the positioning of the end portions 13a and 13b of the mechanical arm 13, which for instance is capable of rotating about a central point thereof. In other words, due to the movement of the mechanical arm 13, the holding means 7a or 7b which is previously at the support 6 is at the storage element 14 and vice versa.

Furthermore, the method of the present disclosure comprises a step of capturing images Img" of the contact probes 4 housed in the storage element 14, the step being made by a second vision system 11", comprising at least one camera connected to the central unit 10. This step is possibly followed by a subsequent step of discarding a contact probe if probe parameters evaluated by the images Img" highly differ from nominal parameters for the contact probe.

Even if the second vision system 11' provides for a first discard of extremely irregular contact probes, the above mentioned step of transforming the profile P of the contact probe 4 at the support 6 into control instructions CI is preceded by a step of comparing the profile P with a nominal profile for the contact probe, the nominal profile being stored in the central unit 10.

The method of the disclosure thus comprises a subsequent discard step of the contact probe 4 if the obtained profile P is far from the nominal profile, for instance outside a predetermined range around the nominal profile or it is in a calculated parameter that is far from a theoretical value, avoiding in this way the assembly of contact probes whose profile is too irregular. In particular, through the first vision system 11', it is possible to calculate the curvature or skew of the contact probe 4, the skew value being compared with a nominal skew value for the particular contact probe. In other words, the skew is the measure, in terms of straightness, of how far the contact probe is from a theoretical probe. In addition to or alternatively, it is possible to also calculate other metrological parameters, such as for instance the local variations of the profile of the contact probe (for instance local variations in concavity or smudging) in order to evaluate the suitability of the contact probe to be assembled, for instance with a discard of profiles which have a change in concavity. In any case, it should be remarked that all these parameters are compared each time with specific parameters for a specific type of contact probes.

It is noted that the profile P of the contact probe 4 is obtained through a step in which a plurality of points 12 along the body 4' of the contact probe 4 is identified, in the projections of the contact probe 4 on two orthogonal planes from the captured images Img'a and Img'b. This step is then followed by an interpolation of the points 12, the interpolation providing the profile P from which the trajectory of the support 6 is obtained. By way of example, the interpolation may be made with points having a pitch varying from 5 μm to 15 μm, preferably of 10 μm. Obviously, the criterion of interpolation, definition and choice of the number of points may vary according to the needs and/or circumstances, for instance it may vary according to the type of contact probes to be assembled.

Suitably, a step of calculating the coordinates of the guide holes 3 of each guide 2 and of storing the coordinates in the central unit 10 is also provided. Specifically, the calculation of the coordinates of the guide holes 3 is based on a precise measure of the guides 2 prior to their alignment.

In particular, the coordinates are calculated with respect to a point of the guides 2 which does not vary further to a rotation thereof (namely the rotation center of the guides 2). In other words, the point (the rotation center of the guides) is the origin of a reference system with respect to which the coordinates of all of the points of the probe head, such as the coordinates of the centers of the guide holes 3, are calculated.

Advantageously according to the present disclosure, the control instructions CI being sent to the support 6, and thus its trajectory, take into account both the profile P of the contact probe 4, and the coordinates of the guide holes 3.

In particular, the present disclosure provides for the central unit 10 to take into account not only the profile P of the contact probe 4, but also the relative misalignment of the guide holes 3 of different guides 2, the relative misalignment being calculated from the coordinates of the guide holes 3 provided to the central unit 10. Moreover, in the calculation of the trajectory, the central unit 10 also takes into account how the coordinates of each point of the guides 2 modify during the movement of the support 6, so as to have an optimal control of the assembly process.

Obviously, the assembly process only starts after a suitable initial calibration step of the apparatus 1, in which for instance the deformation that the guide holes undergo during the movement of the support 6 is adjusted.

It is also possible to provide that, according to the profile P of a contact probe 4, the central unit 10 selects the guide holes 3 in which to house it according to their coordinates and misalignment.

In order to obtain a complete control of the assembly process, a step of detecting the force exerted by the contact probe 4 onto the guides 2 during the movement of the support 6 is also provided, the force being detected through at least one force sensor integrated in the holding means 7a and 7b.

The step of calculating the force exerted by the contact probe 4 is then followed by a step of sending to the central unit 10 data Dat about the force, the data Dat being processed as a function of the position of the contact probe 4 between the guides 2. In other words, the central unit 10 processes the data Dat and produces information about the force exerted by the contact probe 4 onto the guides as a function of its position in the guides 2. Furthermore, the central unit 10 produces a chart, which is visible on a suitable display device, of the force (deformation) of the contact probe 4 as a function of the position and in this way it is possible to have a vision of what happens to the contact probe 4 between the guides 2 during the assembly process.

Suitably, a step of correcting the control instructions CI, and thus the trajectory of the support 6, is then provided, if the force exerted by the contact probe 4 onto the guides exceeds a predetermined value, or the step of interrupting the movement of the support 6 and of trying again the assembly with the same trajectory for a predefined number of times.

Obviously, all the above listed steps are repeated, in an established sequence, for each set of concentric guide holes 3 of the guides 2. Each contact probe 4 is then picked up from the storage element 14 and placed at the predetermined position at the support 6, the latter moving suitably so that the contact probe 4 is housed in the guide holes 3 associated therewith. In this way, each guide hole 3 follows a specific trajectory, which is different from that of the other holes and calculated each time according to the profile of the contact probe to be housed therein and to the coordinates of the holes themselves, the center of each hole following the profile so that the guides 2 may be fitted onto the contact probe 4 in a very precise and effective manner. In other words, the trajectory followed by the centers of the guide holes 3 substantially coincides with the profile P of the contact probe 4.

It is finally noted that, through the holding means 7a and 7b, the contact probes are always carried at the same predetermined position at the support 6, which is placed on a moving element X-Y (not illustrated in the figures) which moves the support 6 in the plane X-Y so as to approach the correct guide hole to the contact probe to be housed therein. In other words, the moving element X-Y provides for a first coarse displacement of the support 6, which will then move in a fine way towards the contact probe through its actuators.

In conclusion, the present disclosure provides an apparatus for the automated assembly of a probe head in which a contact probe is held at a predetermined position by a suitable holding means and, instead of moving the holding means (and thus the contact probe) towards the guide holes of the guides of the probe head to be assembled, it is moved on a support whereon the guides are arranged, the support having a plurality of degrees of freedom of movement and being capable of following a suitable trajectory that is calculated according to the profile of the contact probe so as to fit the guides onto the probe, which is held at the predetermined position through the holding means.

Advantageously according to the present disclosure, the possibility of moving the support of the guides instead of the holding means of the contact probes allows a much greater freedom in the choice of the trajectory to be provided to the support, thus allowing the formation of complex trajectories in a very precise manner.

Furthermore, the simple holding of the contact probes, in the absence of a movement thereof, reduces the risks of their deformations or breakage.

Moreover, the selection of the trajectory of the support according to the profile of the contact probes to be assembled makes the assembly process of the present disclosure no more limited by the shape of the contact probes, the coordinates of the centers of the guide holes suitably following the profile, thus resulting in a remarkable advancement compared to the known solutions.

Furthermore, the coordinates of the guide holes (and thus knowing the relative misalignment of the holes) being known, and the subsequent possibility of adjusting the trajectory of the support according to the coordinates, makes the assembly process no more limited by a possible excessive misalignment of the holes, as it instead happens in the known solutions.

It is moreover observed that the apparatus described in the present disclosure allows an assembly process, which is fully automated as well effective, thus reducing the operator interventions to a minimum.

The preliminary evaluation of the profile of the contact probes through a system of cameras further allows discarding those probes whose profile is excessively far from a nominal profile, thus avoiding interrupting the alignment process in case of probes having a too much irregular profile, as well as avoiding a possible undesired breakage of the probes themselves, thus increasing the production rate with consequent economic advantages and time savings.

The use of robotized supports with six degrees of freedom further allows setting trajectories which are extremely precise, so as to precisely fit the guides onto the contact probe without assembly errors.

Finally, the integration of sensors able to detect the force exerted by the contact probe onto the guides allows a precise vision of what happens to the probe during the movement of the support, thus allowing an extremely precise and complete control of the assembly process.

In essence, the apparatus and method illustrated in the present disclosure effectively solve the problems of the prior arts, thanks to the possibility of moving the support of the guides of the probe head to be assembled according to the profile of the contact probe to be housed in a specific set of concentric guide holes.

From the foregoing it will be appreciated that, although specific embodiments of the disclosure have been described herein for purposes of illustration, various modifications may be made without deviating from the spirit and scope of the disclosure, all included in the protection scope as defined by the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus for an automated assembly of a probe head for testing electronic devices, the apparatus comprising:
   a support configured to support at least two parallel guides, which are provided with a plurality of respective guide holes;
   at least one holding means configured to hold a contact probe to be housed in the guide holes, wherein the support is a movable support configured to be moved according to a preset trajectory between a first position, wherein the contact probe is held at a predetermined position outside the guide holes by the holding means, and a second position wherein the contact probe, which is held at the predetermined position, is housed in a set of guide holes that are substantially concentric to each other;
   actuators of the support; and
   a central unit connected to the actuators, the preset trajectory being calculated in the central unit according to a profile of the contact probe, the central unit being adapted to transform the profile into control instructions which are sent to the actuators of the support.

2. The apparatus according to claim 1, further comprising a first vision system connected to the central unit, the first vision system configured to capture images of the contact probe held by the at least one holding means at the predetermined position, the profile of the contact probe being calculated from the images acquired by the first vision system.

3. The apparatus according to claim 2, wherein the first vision system comprises at least one pair of high-resolution cameras being provided at the support, the cameras forming a stereoscopic vision system for a formation of images of the contact probe.

4. The apparatus according to claim 1, wherein the support is a hexapod having six degrees of freedom of movement adjusted by the actuators.

5. The apparatus according to claim 1, wherein the at least one holding means of the contact probe is a terminal element of a mechanical arm that is configured to move between the support and a storage element, the storage element being configured to contain a plurality of contact probes.

6. The apparatus according to claim 5, wherein the mechanical arm comprises a first end portion including a first holding means, and a second end portion including a second holding means, wherein one of the first or second holding means is configured to hold a contact probe at the predetermined position and the other holding means is configured to simultaneously pick-up a contact probe from the storage element.

7. The apparatus according to claim 5, further comprising a second vision system which captures images of the contact probes housed in the storage element, the central unit being configured to perform a first evaluation of the profile of the contact probes in the storage element based on the images captured by the second vision system, so as to perform a preliminary discard of the contact probes.

8. The apparatus according to claim 1, wherein the at least one holding means comprises at least one pair of end-effectors extending from a body of the at least one holding means, as well as at least one first force sensor which is integrated in the body and is configured to measure a holding intensity of the contact probe exerted by the at least one pair of end-effectors, the apparatus further comprising a feedback system configured to adjust the holding intensity of the contact probe exerted by the at least one pair of end-effectors.

9. The apparatus according to claim 1, wherein the at least one holding means comprises at least one second force sensor configured to measure a force exerted by the contact probe onto the at least two parallel guides during the movement of the support.

10. The apparatus according to claim 1, further comprising at least one further vision system configured to assess which guide hole of the plurality of respective guide holes the contact probe emerges from.

11. An apparatus for an automated assembly of a probe head for testing electronic devices, the apparatus comprising:
   a support configured to support at least two parallel guides, which are provided with a plurality of respective guide holes;
   at least one holding means configured to hold a contact probe to be housed in the guide holes, wherein the support is a movable support configured to be moved according to a preset trajectory between a first position, wherein the contact probe is held at a predetermined position outside the guide holes by the holding means, and a second position wherein the contact probe, which is held at the predetermined position, is housed in a set of guide holes that are substantially concentric to each other;
   actuators of the support; and
   a central unit connected to the actuators, the preset trajectory being calculated in the central unit according to a profile of the contact probe, the central unit being adapted to transform the profile into control instructions which are sent to the actuators of the support;

wherein the at least one holding means comprises at least one pair of end-effectors extending from a body of the at least one holding means, as well as at least one first force sensor which is integrated in the body and is configured to measure a holding intensity of the contact probe exerted by the at least one pair of end-effectors, the apparatus further comprising a feedback system configured to adjust the holding intensity of the contact probe exerted by the at least one pair of end-effectors.

12. The apparatus according to claim 11, further comprising a first vision system connected to the central unit, the first vision system configured to capture images of the contact probe held by the at least one holding means at the predetermined position, the profile of the contact probe being calculated from the images acquired by the first vision system.

13. The apparatus according to claim 12, wherein the first vision system comprises at least one pair of high-resolution cameras being provided at the support, the cameras forming a stereoscopic vision system for a formation of images of the contact probe.

* * * * *